US012650486B2

(12) United States Patent　　(10) Patent No.:　US 12,650,486 B2
Katou et al.　　(45) Date of Patent:　Jun. 9, 2026

(54) CIRCUIT, AND WAVEFORM SENSOR

(71) Applicant: Renesas Electronics Corporation, Tokyo (JP)

(72) Inventors: Norihito Katou, Tokyo (JP); Fukashi Morishita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 269 days.

(21) Appl. No.: 18/482,137

(22) Filed: Oct. 6, 2023

(65) Prior Publication Data

US 2024/0151804 A1　May 9, 2024

(30) Foreign Application Priority Data

Nov. 4, 2022　(JP) .................................. 2022-176856

(51) Int. Cl.
*G01S 5/02*　　(2010.01)
*H03M 1/40*　　(2006.01)

(52) U.S. Cl.
CPC ............. *G01S 5/0205* (2013.01); *H03M 1/40* (2013.01)

(58) Field of Classification Search
CPC ............................... G01S 5/0205; H03M 1/40
See application file for complete search history.

(56) References Cited

U.S. PATENT DOCUMENTS 6,906,657 B1 * 6/2005 A ............................ H03M 1/40
　　　　　　　　　　　　　　　341/122
10,209,829 B2 2/2019 Hara 2011/0068967 A1　3/2011 Mashiyama et al.
2015/0124138 A1　5/2015 Ueda et al.
2016/0320918 A1　11/2016 Hara
2017/0272674 A1 * 9/2017 Tokunaga ............ G11C 27/026
2020/0016206 A1　1/2020 Charych et al.

FOREIGN PATENT DOCUMENTS

JP　　2011066846 A　3/2011
JP　　2015091081 A　5/2015
JP　　　5745712 B1　7/2015
JP　　2020088858 A　6/2020
WO　　2015111159 A1　7/2015

OTHER PUBLICATIONS

JP Office Action dated Dec. 19, 2025 issued in JP Appl 2022-176856.
Nakamura, A practical use of circuit simulator to design AD converter, pp. SS20-SS21, IEICE 2015. 7 pages.

* cited by examiner

*Primary Examiner* — Joseph J Lauture
(74) *Attorney, Agent, or Firm* — SCULLY, SCOTT, MURPHY & PRESSER, P.C.

(57)　　　ABSTRACT

A circuit including a first circuit, a second circuit and a controller is provided, the first circuit and the second circuit each including a sample-and-hold circuit configured to hold a level of an input signal of a specific timing and an analog-to-digital converter circuit configured to convert the level of the input signal held in the sample-and-hold circuit into digital data and to output the digital data, the controller being configured to cause the first circuit to output the level of the input signal of a first timing and to cause the second circuit to output the level of the input signal of a second timing.

6 Claims, 13 Drawing Sheets

<u>161</u>

161

TIME

NUMBER i OF ADC CIRCUIT 16 (NUMBER AT SAMPLING TIMING)

NUMBER i OF ADC CIRCUIT 16 (NUMBER AT SAMPLING TIMING)

NUMBER i OF ADC CIRCUIT 16 (NUMBER AT SAMPLING TIMING)

CIRCUIT, AND WAVEFORM SENSOR

CROSS-REFERENCE TO RELATED APPLICATION

This application claims priority under 35 U.S.C. § 119 to Japanese Patent Application No. 2022-176856, filed on Nov. 4, 2022. The disclosure of Japanese Patent Application No. 2022-176856, including the specification, drawings and abstract is incorporated herein by reference in its entirety.

BACKGROUND

The present disclosure relates to a circuit and a waveform sensor.

Recently, techniques for, for example, detecting a position of an electronic pen or the like by detecting a waveform of a wireless sinewave or the like from the electronic pen or the like in a tablet or the like have been known. Techniques such as successive approximation register (SAR) analog-to-digital converter (ADC) and column ADC in which an ADC is provided for each column have been known as techniques for converting an analog signal indicating the position of the electronic pen or the like into a digital signal.

There is disclosed technique listed below.
[Patent Document 1] Japanese Patent No. 5745712

However, in related arts, it is occasionally difficult to, for example, improve a frequency of sampling in a waveform sensor. Other problems and novel characteristics will be apparent from the description of the present specification and the accompanying drawings.

SUMMARY

One embodiment provides a circuit including a first circuit, a second circuit and a controller, the first circuit and the second circuit each including a sample-and-hold circuit configured to hold a level of an input signal at a specific timing, and an analog-to-digital converter circuit configured to convert a level of the input signal held in the sample-and-hold circuit into digital data and to output the digital data, and the controller being configured to cause the first circuit to output a level of the input signal of a first timing and to cause the second circuit to output a level of the input signal of a second timing.

According to one aspect, a frequency of sampling in a waveform sensor can be improved.

BRIEF DESCRIPTIONS OF THE DRAWINGS

Figure 1:
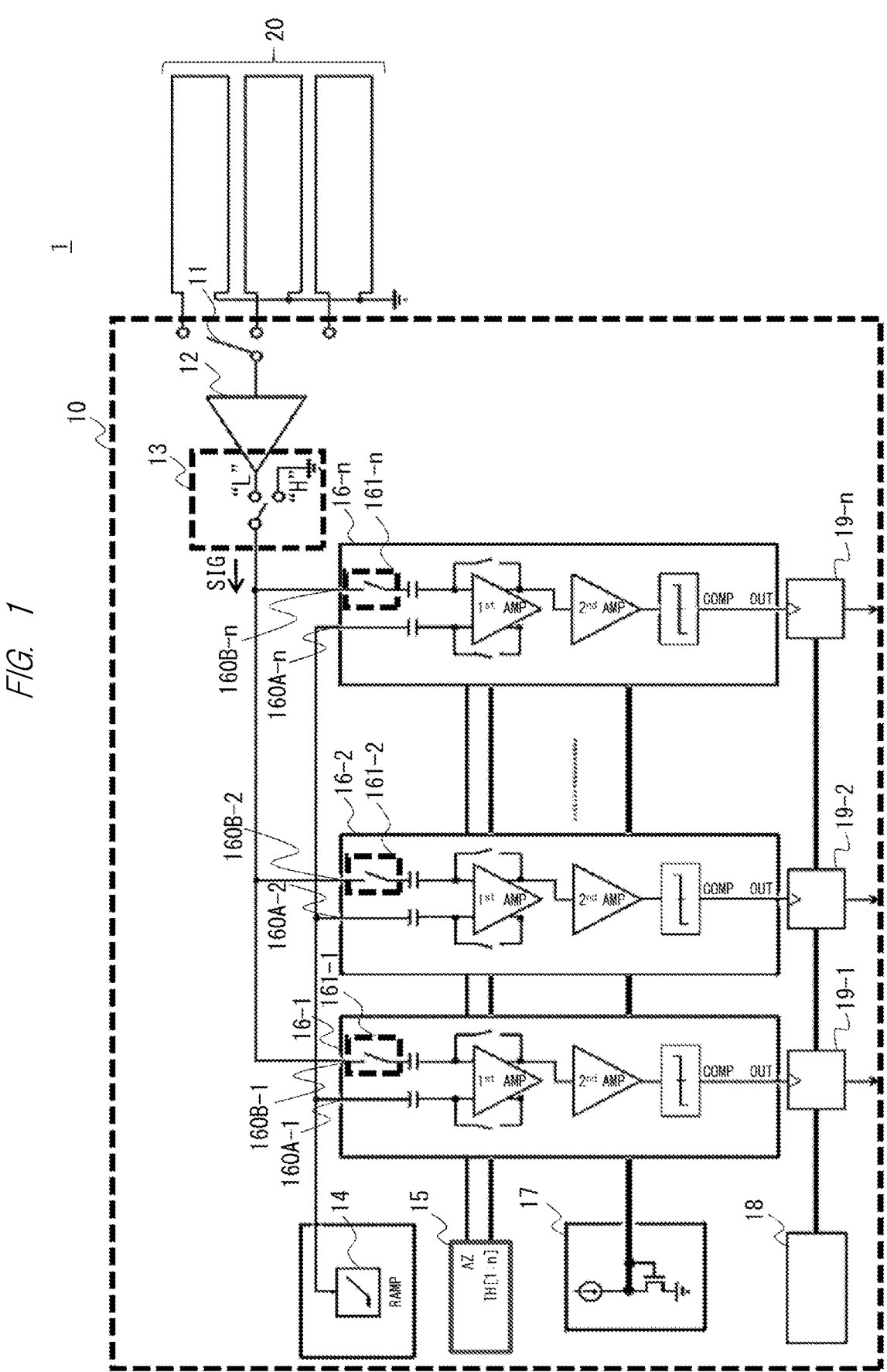
Figure 2:
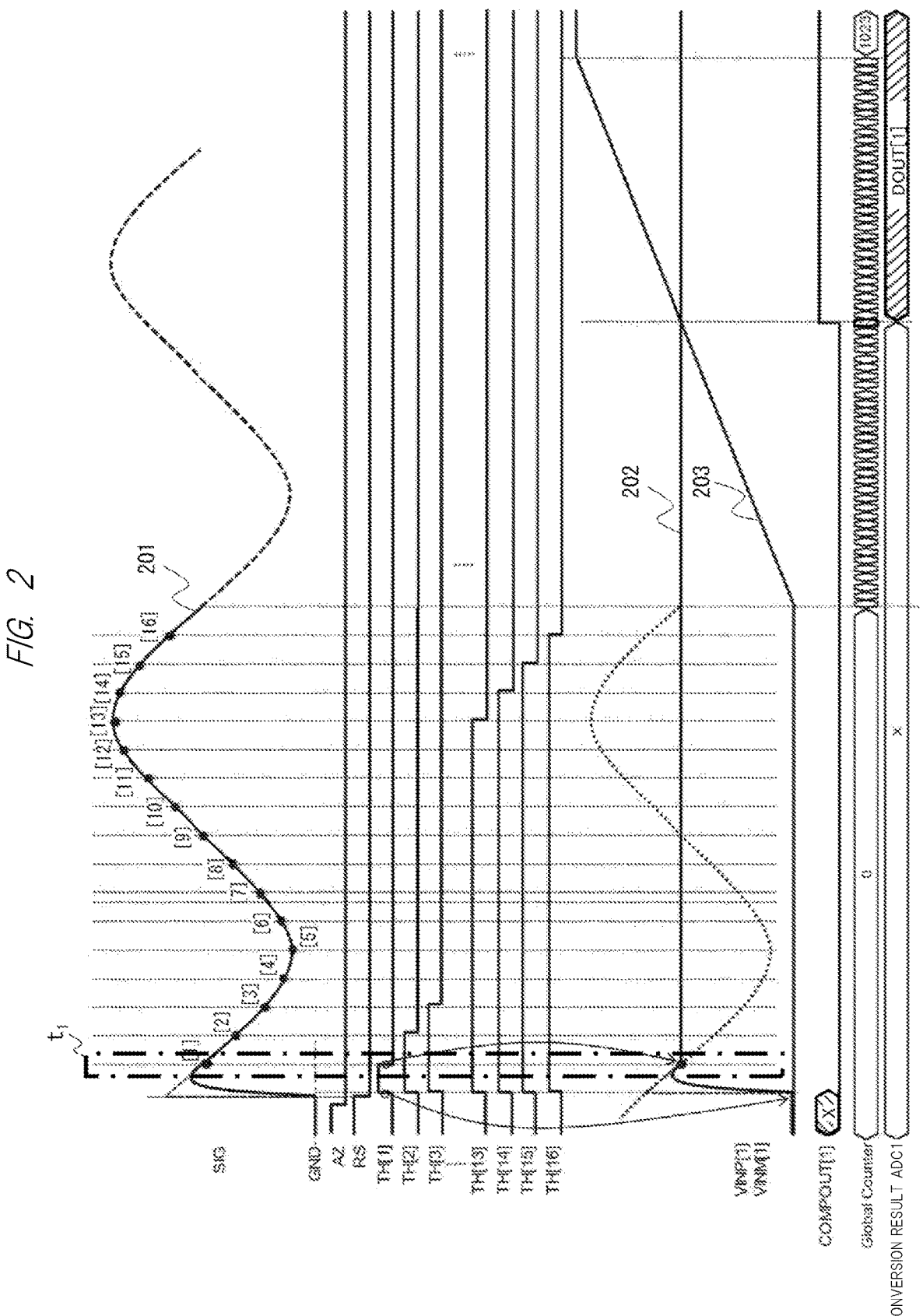
Figure 3:
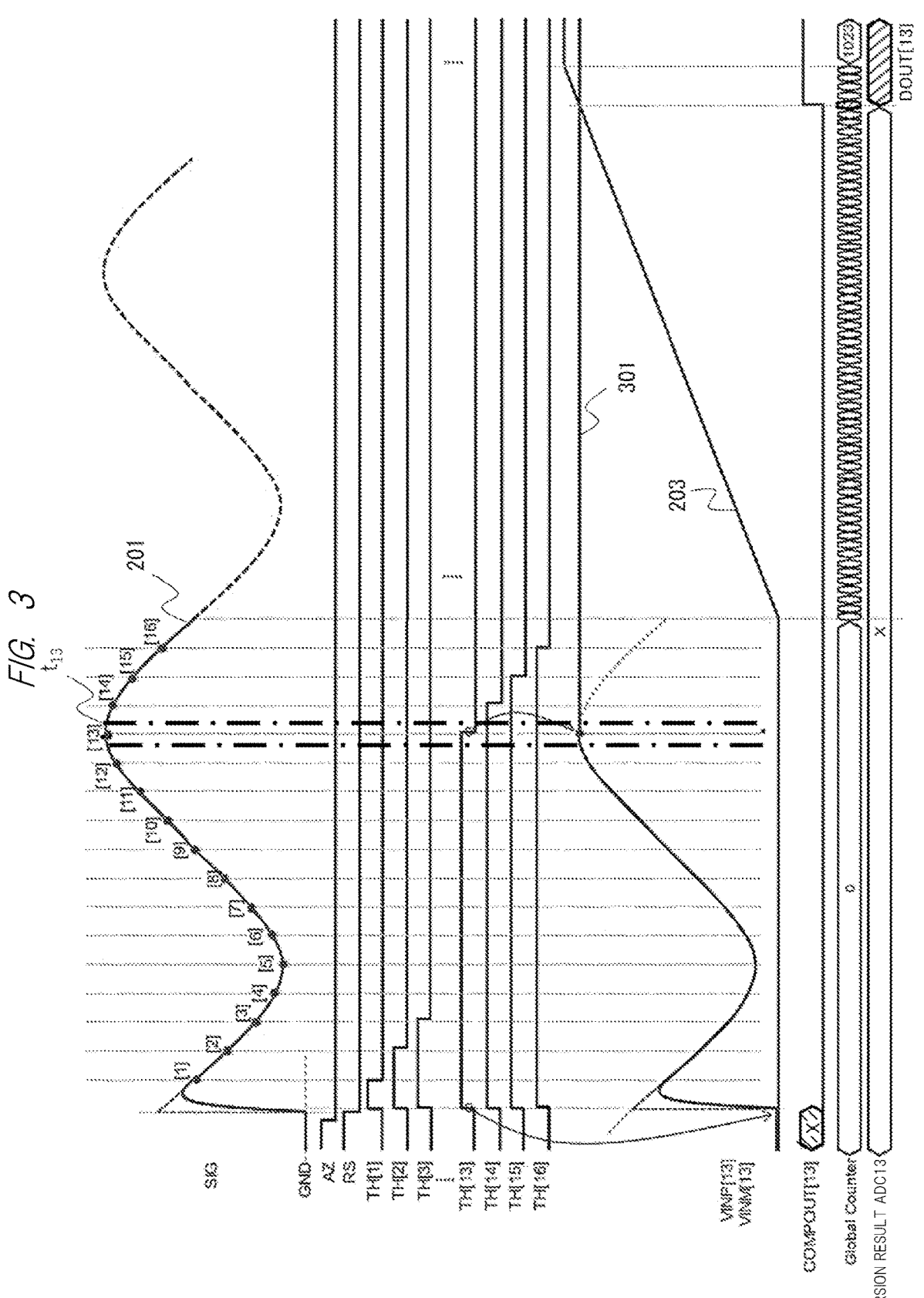
Figure 4:
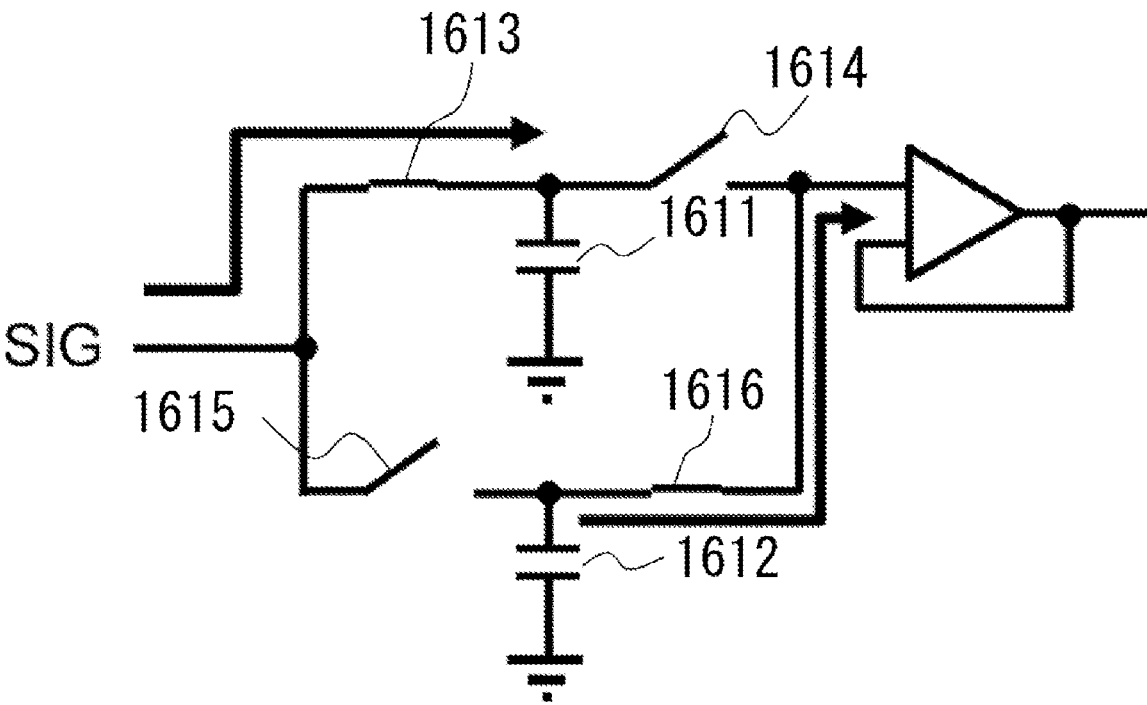
Figure 5:
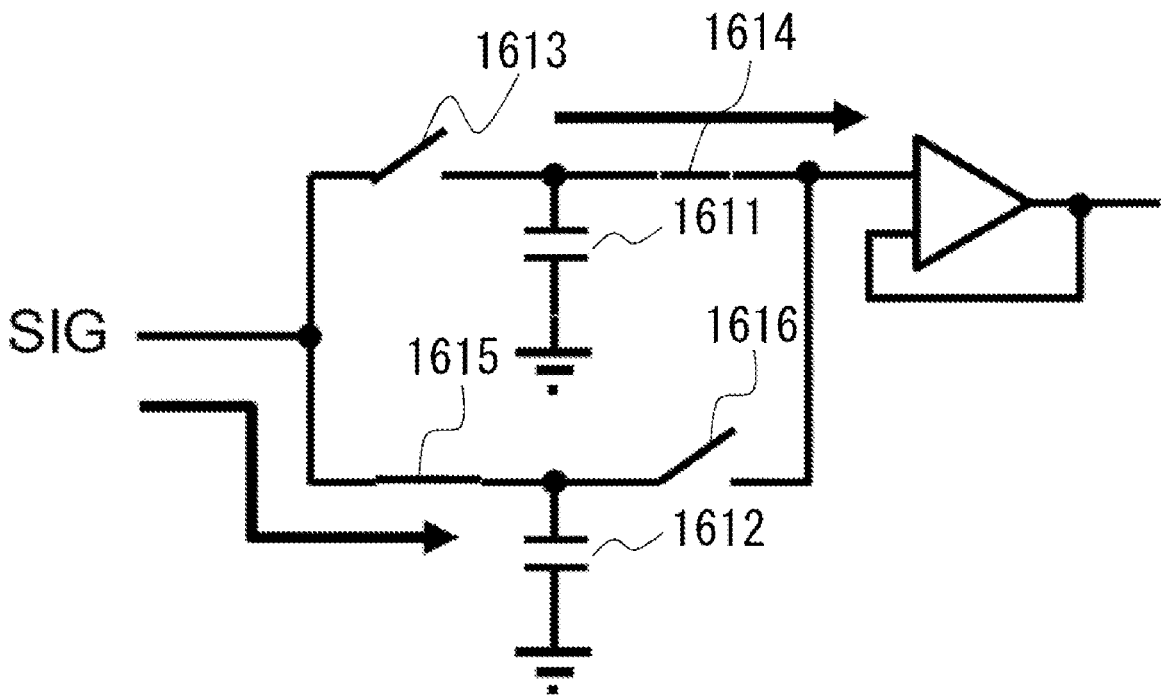

FIG. 1 is a diagram of one exemplary configuration of a waveform sensor according to a first embodiment.
FIG. 2 is a timing chart of exemplary processings of the waveform sensor according to the first embodiment.
FIG. 3 is a timing chart of exemplary processings of the waveform sensor according to the first embodiment.
FIG. 4 is a diagram of one exemplary processing of AD converting a value being sampled and held at a second capacitance during sampling and holding at a first capacitance of a sample-and-hold circuit according to the first embodiment.
FIG. 5 is a diagram of one exemplary processing of AD converting a value being sampled and held at the first capacitance during sampling and holding at the second capacitance of the sample-and-hold circuit according to the first embodiment.

Figure 6:
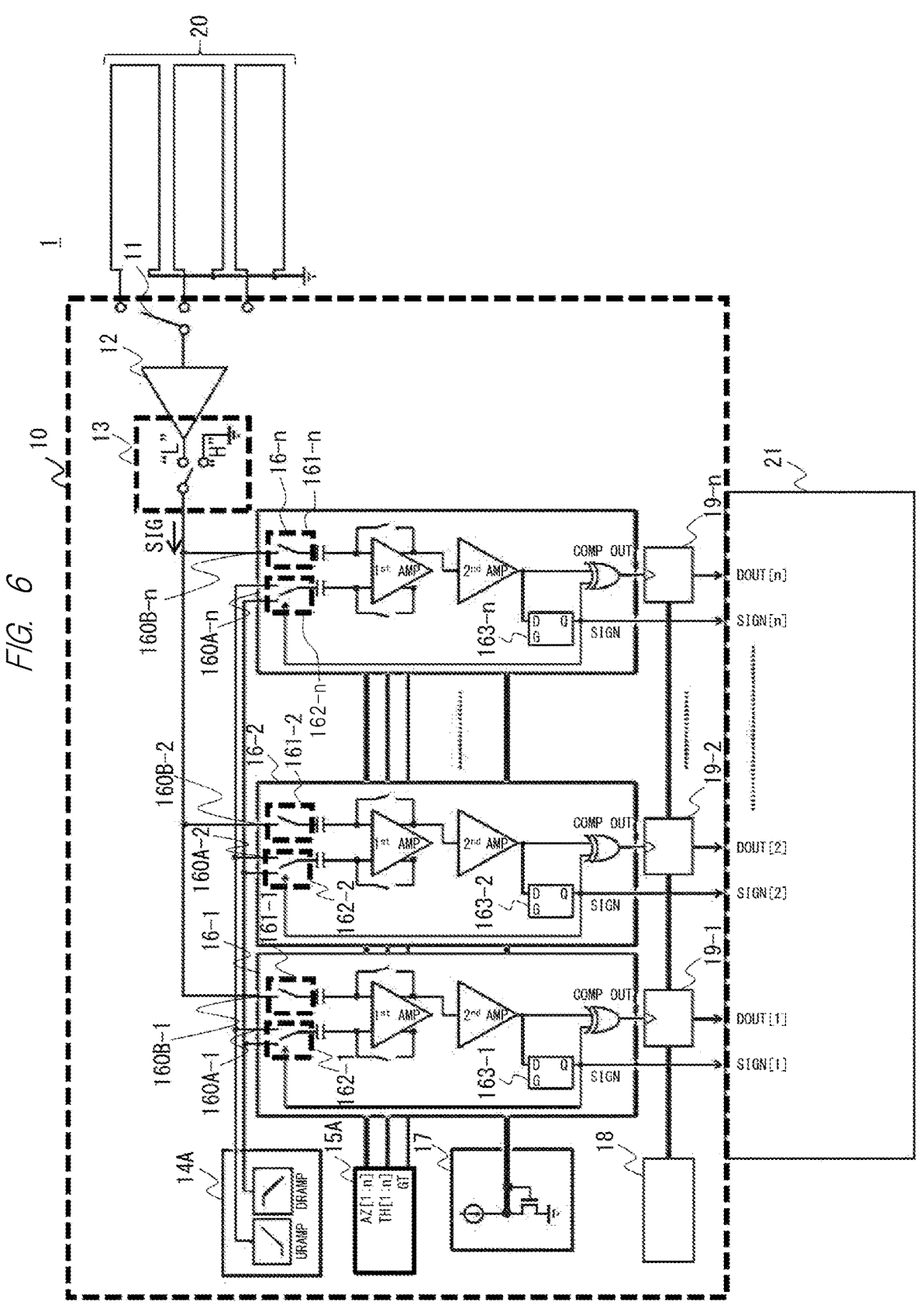
Figure 7:
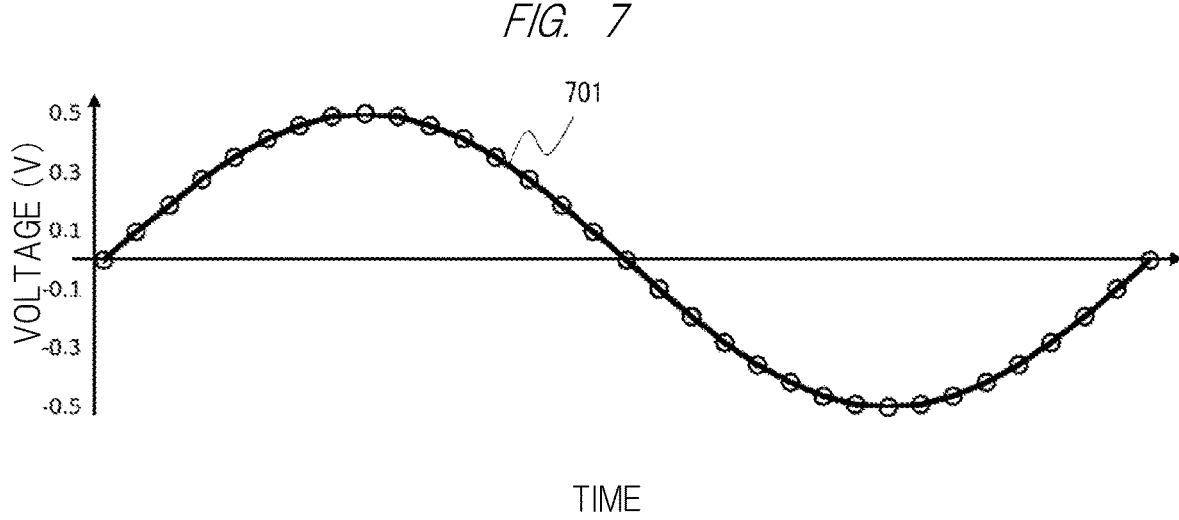
Figure 8:
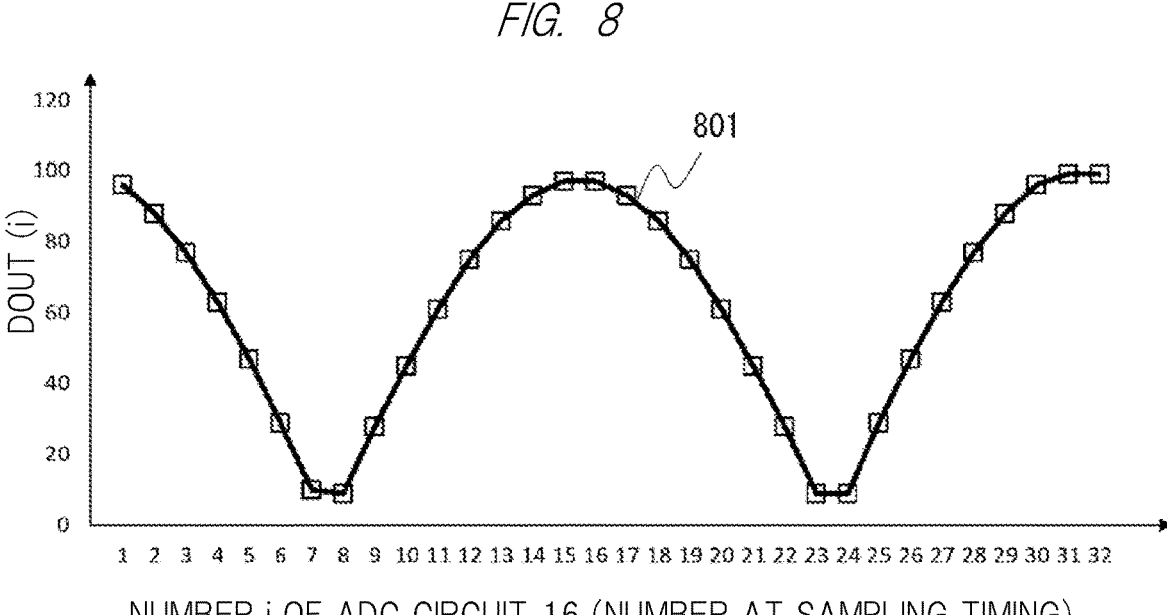
Figure 9:
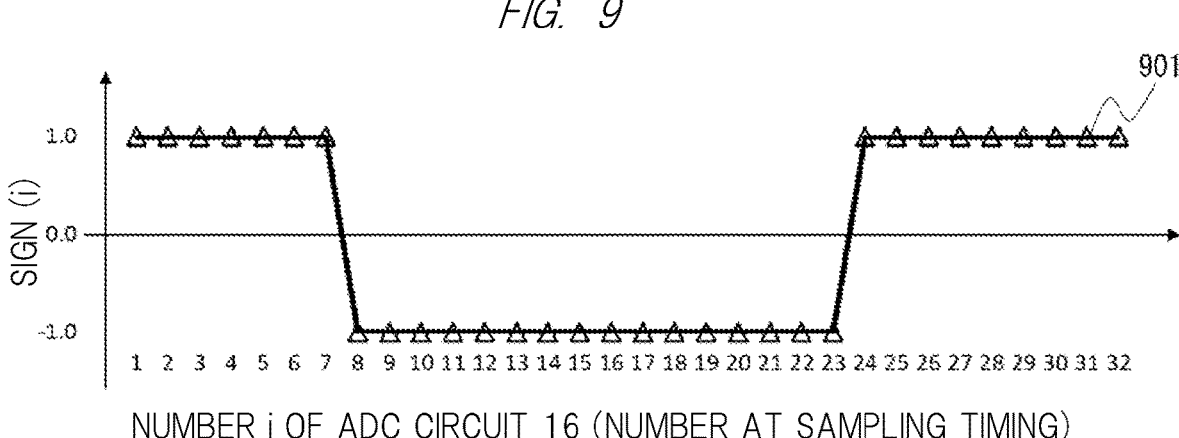
Figure 10:
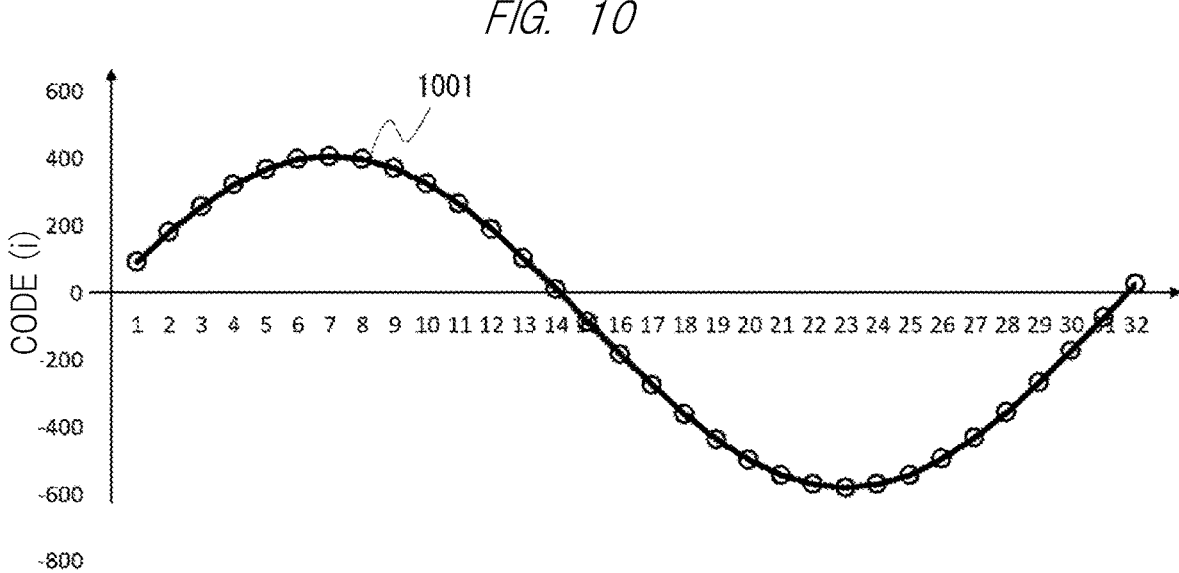
Figure 11:
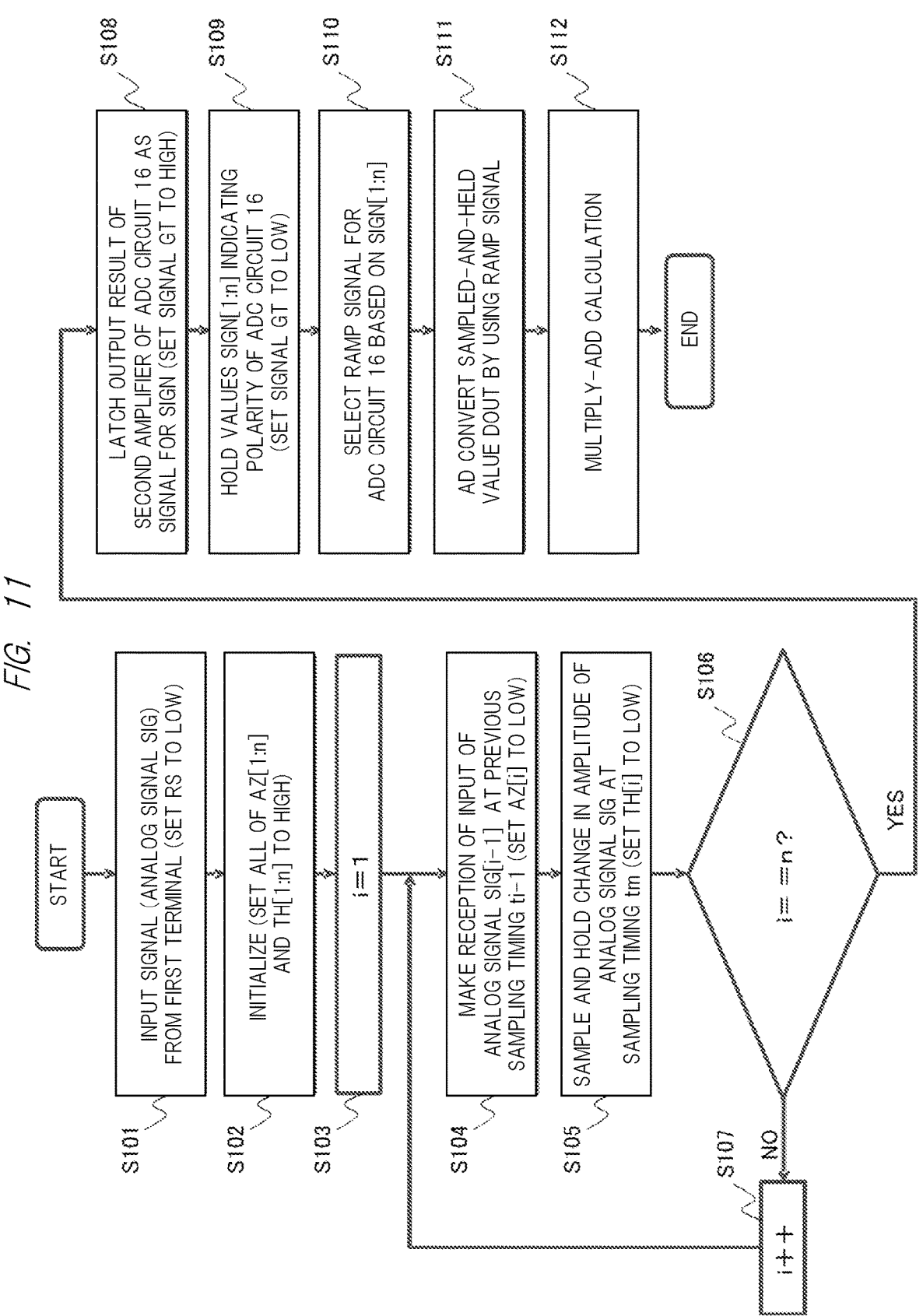
Figure 12:
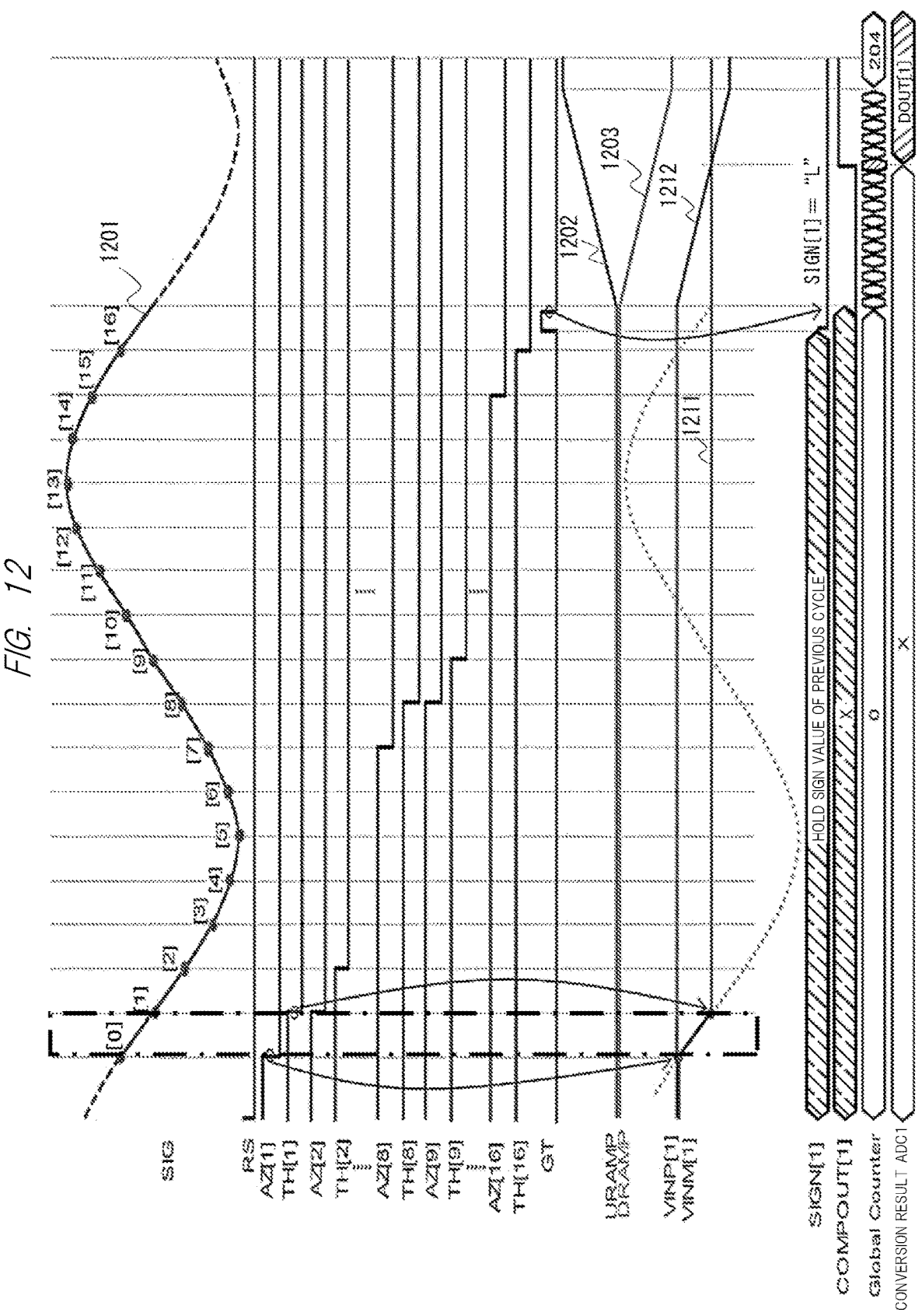
Figure 13:
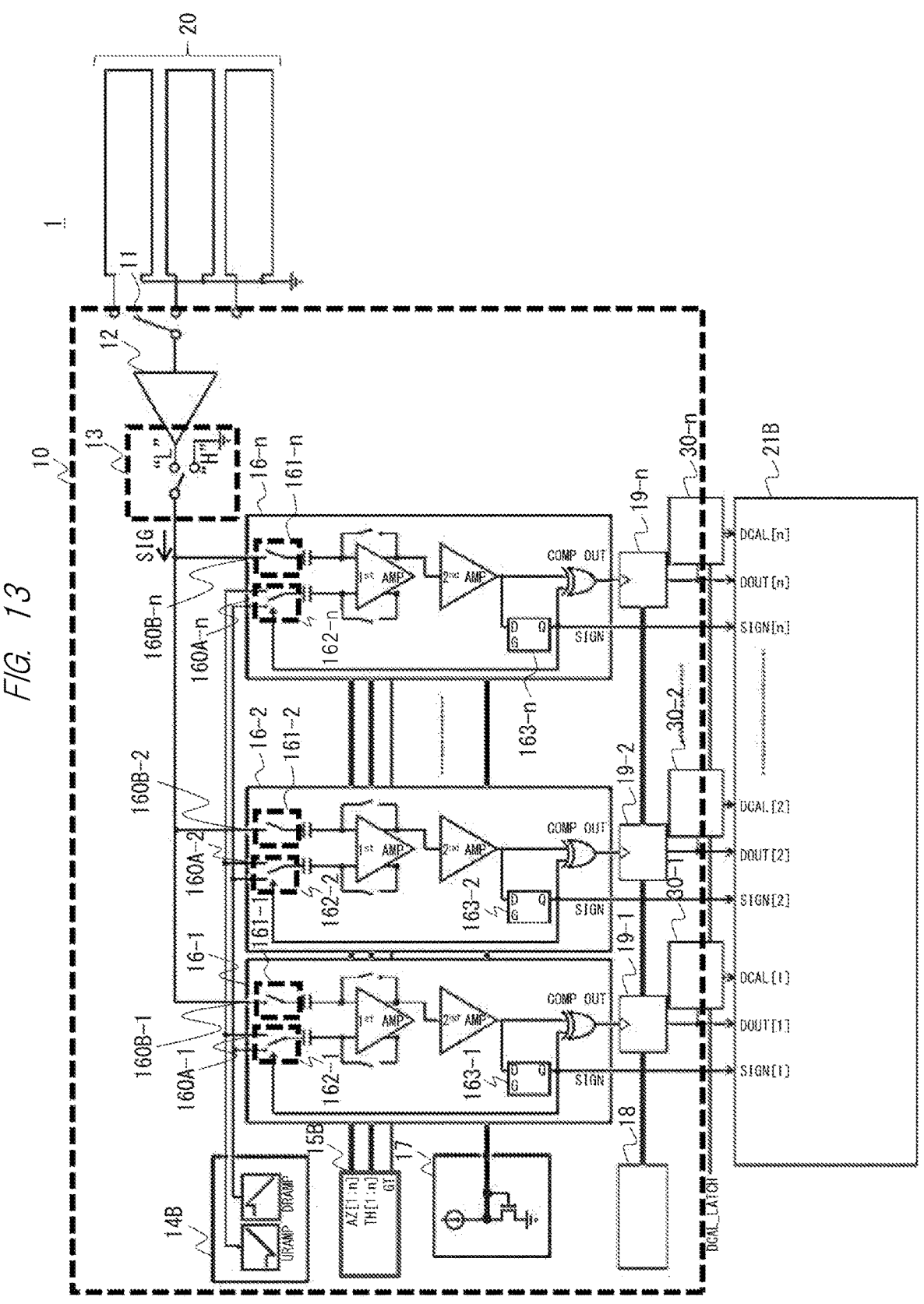
Figure 14:
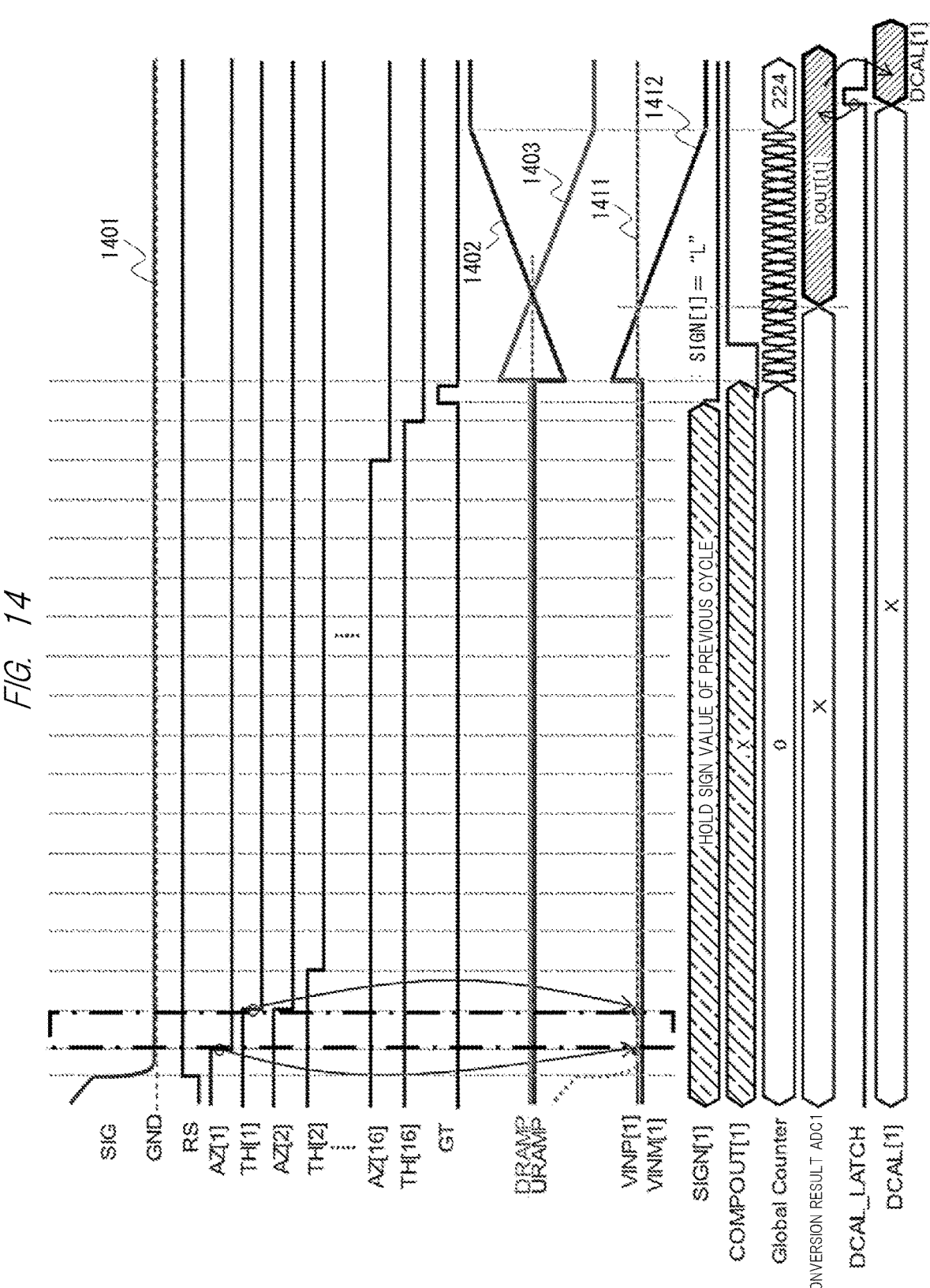
Figure 15:
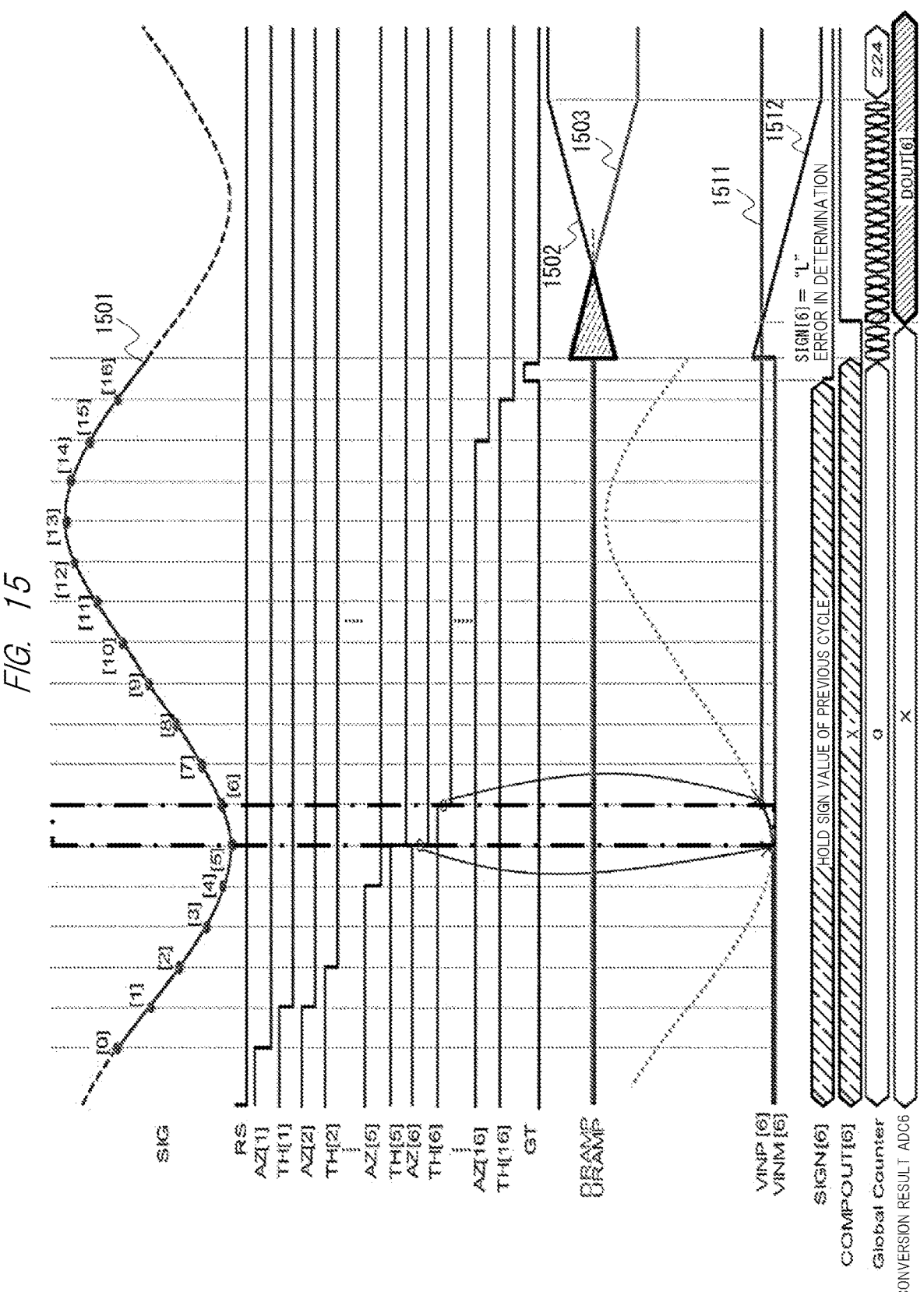

FIG. 6 is a diagram of one exemplary configuration of a waveform sensor according to a second embodiment.
FIG. 7 is a diagram of one exemplary amplitude of a voltage of an analog signal according to the second embodiment.
FIG. 8 is a diagram of one exemplary absolute value of a change in amplitude of a voltage of the analog signal of each sampling timing from its previous sampling timing according to the second embodiment.
FIG. 9 is a diagram of one exemplary polarity value of a change in amplitude of the voltage of the analog signal of each sampling timing from its previous sampling timing according to the second embodiment.
FIG. 10 is a diagram of one exemplary calculation result of the amplitude of the voltage of the analog signal of each sampling timing according to the second embodiment.
FIG. 11 is a flowchart of exemplary processings of the waveform sensor according to the second embodiment.
FIG. 12 is a timing chart of exemplary processings of the waveform sensor according to the second embodiment.
FIG. 13 is a diagram of one exemplary configuration of a waveform sensor according to a third embodiment.
FIG. 14 is a timing chart of one exemplary processing of storing a calibration value DCAL into a calibration value storage latch according to the third embodiment.
FIG. 15 is a timing chart of one exemplary processing of AD converting the analog signal according to the third embodiment.

DETAILED DESCRIPTION

Principles of the present disclosure will be described with reference to some exemplary embodiments. It should be understood that the embodiments are described for example only, and support those skilled in the art to understand and embody the present disclosure without limiting the scope of the present disclosure. The disclosure described in the present specification is embodied in various methods other than as described below. In the following description and claims, all of the technical terms and the scientific terms used in the present specification have the same meanings readily understood by those skilled in the art to which the present disclosure pertains unless otherwise defined. Embodiments according to the present disclosure will be described below with reference to the drawings.

First Embodiment

<Configuration>
A configuration of a waveform sensor 1 according to a first embodiment will be described with reference to FIG. 1. FIG. 1 is a diagram of one exemplary configuration of the waveform sensor 1 according to the first embodiment. The waveform sensor 1 includes a circuit 10 and a group of antenna coils 20.

Each antenna coil included in the group of antenna coils 20 receives a sinusoidal analog signal transmitted from an electronic pen in a vertical or horizontal direction (column) on a screen of an information processing apparatus such as tablet, smartphone or notebook-type personal computer. Note that a sinewave with the largest amplitude is detected from an antenna coil which is nearest to the electronic pen among the antenna coils of the group of antennal coils 20. Thus, the position of the electronic pen on the screen can be calculated by, for example, stacking a waveform sensor 1 including vertical columns and a waveform sensor 1 including horizontal columns.

The circuit 10 includes an antenna coil changeover switch 11, a gain amplifier 12, an input signal reset switch 13, a RAMP generation circuit 14, a controller 15, a bias 17, and a global counter 18. The circuit 10 further includes analog-to-digital converter (ADC) circuits 16-1, 16-2, . . . , 16-n (which may be simply denoted as "ADC circuit(s) 16" later unless discrimination is necessary). A term "n" is an optional natural number. The ADC circuits 16-1, 16-2, . . . , 16-n include sample-and-hold circuits 161-1, 161-2, . . . , 161-n (which may be simply denoted as "sample-and-hold circuit(s) 161" later unless discrimination is necessary), respectively.

The ADC circuits 16-1, 16-2, . . . , 16-n include first terminals 160A-1, 160A-2, . . . , 160A-n (which may be simply denoted as "first terminal(s) 160A" later unless discrimination is necessary) and second terminals 160B-1, 160B-2, . . . , 160B-n (which may be simply denoted as "second terminal(s) 160B" later unless discrimination is necessary), respectively.

The circuit 10 further includes latches 19-1, 19-2, . . . , 19-n (which may be simply denoted as "latch(es) 19" later unless discrimination is necessary). Note that the circuit 10 may be mounted as one chip (integrated circuit).

The antennal coil changeover switch 11 switches (selects) an antenna coil that outputs a signal to the circuit 10 among the antenna coils included in the group of antenna coils 20. To the ADC circuits 16, the RAMP generation circuit 14 outputs signals (RAMP signal, reference signal) whose voltages linearly (in linear functional form) increase or decrease with respect to time.

The controller 15 transmits signals to the ADC circuits 16, and controls the ADC circuits 16. To the ADC circuits 16, the controller 15 transmits the same auto-zero signal AZ (common among the ADC circuits 16) and control signals TH[1:n] (TH[1] to TH[n]) for designating a sampling timing of each ADC circuit 16.

The controller 15 turns on the sample-and-hold circuits 161 by setting (changing) the auto-zero signal AZ to LOW at timing to, and causes the ADC circuits 16 to take (receive) input of an analog signal SIG. Then, the controller 15 sequentially turns off the sample-and-hold circuits 161 at different timings, and causes each sample-and-hold circuit 161 to record a value of the amplitude of the analog signal SIG of each timing. Then, the controller 15 causes the sample-and-hold circuits 161 to AD convert and output the values recorded in the sample-and-hold circuits 161. For example, the controller 15 causes the sample-and-hold circuits 161-1, 161-2, . . . , 161-n in the ADC circuits 16 to record the input voltages VINP[1:n] of the analog signal SIG of timings $t_1$, . . . , $t_n$ and to AD convert and output the recorded values (the levels, the values of the amplitude). In this manner, one column is provided with 32 ADC circuits capable of sampling at up to 250 kHz, and thus, this column can be sampled at 8 MHz.

The bias 17 supplies power to the ADC circuits 16. The global counter 18 supplies a counter signal to the latches 19.

The ADC circuit 16 includes the first terminal (first input section) 160A configured to receive input of the analog signal SIG from the antenna coil included in the group of antenna coils 20 and the second terminal (second input section) 160B configured to receive input of the RAMP signal from the RAMP generation circuit 14. The ADC circuit 16 converts the analog signal SIG into a digital (discrete) signal.

The ADC circuit 16 includes so-called single-slope ADC. Thus, the ADC circuit 16 starts counting during change of the voltage of the RAMP signal input into the second terminal 160B. When the voltage of the RAMP signal input into the second terminal 160B exceeds (crosses with) the voltage (pixel voltage) of the analog signal SIG input into and sampled and held in the first terminal 160A, a comparator in the ADC circuit 16 inverts. As a result, the counter value is held in the latch 19. Thus, the counter value (counter code) is acquired, the counter value being larger as the time taken from the start to the stop of the counting is longer. In the first embodiment, the counter value is a digital value corresponding to the voltage of the analog signal SIG.

<Processings (Operations)>

Next, exemplary processings of the waveform sensor 1 according to the first embodiment will be described with reference to FIGS. 2 to 5. FIGS. 2 and 3 are timing charts of exemplary processings of the waveform sensor 1 according to the first embodiment. FIG. 4 is a diagram of one exemplary processing of AD converting a value being sampled and held at a second capacitance during sampling and holding at a first capacitance of the sample-and-hold circuit 161 according to the first embodiment. FIG. 5 is a diagram of one exemplary processing of AD converting a value being sampled and held at the first capacitance during sampling and holding at the second capacitance of the sample-and-hold circuit 161 according to the first embodiment.

In FIGS. 2 and 3 illustrate an example of a waveform 201 of an amplitude of the voltage of the analog signal SIG output from one antenna coil, the auto-zero signal AZ, a state RS of the input signal reset switch 13, the control signals TH[1] to [16] output from the controller 15 to the ADC circuits 16, and a value (Global Counter) of the global counter 18 in which the number "n" of ADC circuits 16 is 16 and the horizontal axis represents time.

FIG. 2 illustrates a comparison between a waveform 202 of an input voltage VINP[1] at the first terminal 160A receiving input of the analog signal SIG and a waveform 203 of an input voltage VINM[1] (a waveform of a voltage of a common RAMP signal) at the second terminal 160B receiving input of the RAMP signal in the ADC circuit 16-1. The ADC circuit 16 is so-called single-slope ADC, and thus, AD-converts and outputs a digital value corresponding to the voltage of the analog signal SIG caused when the waveform 202 crosses with the waveform 203. The input voltages VINP[1:n] correspond to the signals to be input into the input terminals of the first amplifiers AMP (1st AMP) in the ADC circuits 16-1 to 16-n, respectively. Thus, the input voltage VINP[1] corresponds to a signal to be input into the input terminal of the first amplifier AMP in the ADC circuit 16-1.

FIG. 2 further illustrates an output state COMPOUT[1] from the ADC circuit 16-1 to the latch 19-1 and an AD conversion result (conversion result ADC1) of the ADC circuit 16-1.

HIGH (H, 1) of the state RS of the input signal reset switch 13 indicates ground while LOW (L, 0) of the same indicates connection with an antenna coil as shown in FIG. 1. LOW (L, 0) of the output state COMPOUT[1] indicates no output while HIGH (H, 1) of the same indicates output.

FIG. 3 illustrates a comparison between a waveform 301 of an input voltage VINP[13] at the first terminal 160A receiving input of the analog signal SIG and the waveform 203 of an input voltage VINM[13] (a waveform of a voltage of a common RAMP signal) at the second terminal 160B receiving input of the RAMP signal in the ADC circuit 16-13. FIG. 3 further illustrates an output state COMPOUT [13] from the ADC circuit 16-13 to the latch 19-13 and an AD conversion result (conversion result ADC13) of the ADC circuit 16-13. The input voltage VINP[13] corresponds to a signal to be input into the input terminal of the first amplifier AMP in the ADC circuit 16-13.

(Exemplary Configuration for Operation in Pipeline)

As illustrated in FIG. 4 and FIG. 5, the waveform sensor 1 may operate the sample-and-hold circuits 161 and the ADC circuits 16 in pipeline. In the manner, for example, a processing of sampling and holding at one capacitance out of a plurality of capacitances included in the sample-and-hold circuit 161 and a processing of AD converting a value sampled and held in other capacitance out of the plurality of capacitances can be performed in parallel.

In the examples of FIGS. 4 and 5, the sample-and-hold circuit 161 includes a capacitance 1611, a capacitance 1612, a switch 1613, a switch 1614, a switch 1615, a switch 1616 and others. The numbers of capacitances and switches included in the sample-and-hold circuit 161 are not limited to the numbers in the examples of FIGS. 4 and 5.

In the example of FIG. 4, a value being sampled and held at the capacitance 1612 is AD converted by the ADC circuit 16 during sampling and holding at the capacitance 1611 of the sample-and-hold circuit 161. By the AD conversion of the value being sampled and held at the capacitance 1612, the switch 1613, the switch 1614, the switch 1615, and the switch 1616 are switched to be turned on or off, and transit to the state of FIG. 5.

In the example of FIG. 5, a value being sampled and held at the capacitance 1611 is AD converted by the ADC circuit 16 during sampling and holding at the capacitance 1612 of the sample-and-hold circuit 161. When the value being sampled and held at the capacitance 1611 is AD converted, the switch 1613, the switch 1614, the switch 1615, and the switch 1616 are switched to be turned on or off, and transit again to the state of FIG. 4.

Second Embodiment

In the first embodiment, the example of the AD conversion after sampling and holding at all the sample-and-hold circuits 161 has been explained. In a second embodiment, an example in which a dynamic range of the RAMP signal (ramp wave) is made narrower than in the first embodiment by taking a difference in voltage between a previous voltage and a present voltage into the first amplifier AMP in each ADC circuit 16 will be explained. A period for the AD conversion performed in the single-slope ADC varies depending on a period in which the ramp wave increases or decreases. The decrease in the dynamic range of the ramp wave shortens the period in which the ramp wave increases or decreases. Thus, the period for the AD conversion processing can be made shorter in the second embodiment than in the first embodiment. Thus, the frequency of sampling can be further improved. Differences of the second embodiment from the first embodiment will be mainly described below. The configuration of the second embodiment and the configuration of the first embodiment (such as configuration for the operation in pipeline as described above) may be at least partially combined as needed.

<Configuration>

A configuration of the waveform sensor 1 according to the second embodiment will be described with reference to FIG. 6. FIG. 6 is a diagram of one exemplary configuration of the waveform sensor 1 according to the second embodiment. The waveform sensor 1 according to the second embodiment is different from the waveform sensor 1 according to the first embodiment in FIG. 1 in that it includes a RAMP generation circuit 14A and a controller 15A instead of the RAMP generation circuit 14 and the controller 15. And, inclusion of a multiply-add calculator circuit 21 is also different. Also, a further main different point is that the ADC circuits 16-1, 16-2, . . . , 16-n include upstream/downstream ramp change-over switches 162-1, 162-2, . . . , 162-n (which may be simply denoted as "upstream/downstream ramp changeover switch(es) 162" later unless discrimination is necessary) and code determinators 163-1, 163-2, . . . , 163-n (which may be simply denoted as "code determinator(s) 163" later unless discrimination is necessary), respectively. In the example of FIG. 6, the code determinator 163 is achieved by use of so-called D latch.

To the ADC circuits 16, the RAMP generation circuit 14A outputs a signal (upstream RAMP signal) whose voltage linearly (in a linear function form) increases with respect to time and a signal (downstream RAMP signal) whose voltage linearly (in a linear function form) decreases with respect to time in a state in which an intercept is a certain voltage (such as about half of a power voltage).

The controller 15A transmits signals to the ADC circuits 16 to control the ADC circuits 16. To the ADC circuits 16, the controller 15A transmits the auto-zero signals AZ[1:n] (AZ[1] to AZ[n]) for instructing each ADC circuit 16 to receive input of data sampled at a previous sampling timing. As similar to the controller 15 according to the first embodiment, to the ADC circuits 16, the controller 15A transmits the control signals TH[1:n] (TH[1] to TH[n]) for designating a sampling timing of each ADC circuit 16. To the ADC circuits 16, the controller 15A transmits the same signal GT (common among the ADC circuits 16) for controlling the code determinators 163 in the ADC circuits 16.

In the example of FIG. 6, as similar to the first embodiment of FIG. 1, the ADC circuit 16 includes so-called single-slope ADC. Thus, when the voltage of the RAMP signal input into the second terminal 160B exceeds (crosses with) the voltage (pixel voltage) of the analog signal SIG input into and sampled and held in the first terminal 160A, a comparator inverts. As a result, the counting is stopped. In the second embodiment, the counter value is a digital value corresponding to a change of the voltage of the analog signal SIG (that is a differential value of a waveform of the voltage of the analog signal SIG).

<Processings (Operations)>

Next, exemplary processings of the waveform sensor 1 according to the second embodiment will be described with reference to FIGS. 7 to 10. FIG. 7 is a diagram of an exemplary amplitude of the voltage of the analog signal SIG according to the second embodiment. FIG. 8 is a diagram of an exemplary absolute value of a change in amplitude of the voltage of the analog signal SIG of each sampling timing from its previous sampling timing according to the second embodiment. FIG. 9 is a diagram of an exemplary polarity value of a change in amplitude of the voltage of the analog signal SIG of each sampling timing from its previous sampling timing according to the second embodiment. FIG. 10 is a diagram of an exemplary calculation result of the amplitude of the voltage of the analog signal SIG of each sampling timing according to the second embodiment.

The controller 15A causes the ADC circuit 16-i to take (receive) input of the analog signal SIG by setting (changing) the auto-zero signal AZ[i] for the ADC circuit 16-i to LOW at sampling timing $t_{i-1}$ previous to sampling timing $t_i$ in each ADC circuit 16 (which will be denoted as "ADC circuit 16-i" below. A term "i" is a natural number between 1 to n).

The controller 15A turns off switch of the ADC circuit 16-i by setting (changing) the control signal TH[i] for the ADC circuit 16-*i* to LOW at the sampling timing t*i*, and causes the sample-and-hold circuit 161-*i* to record a value indicating the change from the timing t*i-1* to the timing t*i* in amplitude (voltage difference) of the analog signal SIG. the controller 15A causes the sample-and-hold circuit 161-*i* to output, to the multiply-add calculator circuit 21, an AD-converted value DOUT[i] of the counter value corresponding to the recorded level.

The controller 15A causes the code determinator 163-*i* to output, to the multiply-add calculator circuit 21, a value SIGN[i] indicating the polarity (sign, "+" or "−") of the change in amplitude of the analog signal SIG from the timing t*i-1* to the timing t*i* until a next sampling timing at the ADC circuit 16-*i* after the sampling timing t*i*. For example, the value is "−1" when the output from the code determinator 163 is LOW, and the value is "+1" when the output therefrom is HIGH.

The multiply-add calculator circuit 21 calculates a value CODE[i] indicating the amplitude of the analog signal SIG of timing t*i* as shown in the following mathematical expression 1.

[Mathematical Expression 1]

$$CODE[i] = \sum_{i=1}^{n} DOUT[i] \cdot SIGN[i] \qquad (1)$$

In the mathematical expression 1, a value obtained by multiplying a value DOUT by a value SIGN for the ADC circuits 16-1 to 16-*i* is calculated, and the values of the ADC circuits 16 are added (accumulated).

FIG. 7 illustrates an exemplary waveform 701 of the analog signal SIG assuming the horizontal axis represents time and the vertical axis represents the voltage of the analog signal SIG. FIG. 8 illustrates an exemplary waveform 801 of the absolute value DOUT[i] of a change in amplitude relative to the waveform 701 of the analog signal SIG of FIG. 7 assuming that the number "n" of ADC circuits 16 is 32, the horizontal axis represents a sampling timing, and the vertical axis represents the value DOUT[i] of the AD conversion result of the ADC circuit 16.

FIG. 9 illustrates an exemplary waveform 901 of the polarity SIGN[i] of a change in amplitude relative to the waveform 701 of the analog signal SIG of FIG. 7 assuming that the number "n" of ADC circuits 16 is 32, the horizontal axis represents each sampling timing, and the vertical axis represents a value of SIGN[i] of each ADC circuit 16. FIG. 10 illustrates an exemplary waveform 1001 of CODE[i] relative to the waveform 701 of the analog signal SIG of FIG. 7 assuming that the number "n" of ADC circuits 16 is 32, the horizontal axis represents each sampling timing, and the vertical axis represents a value of CODE[i] indicating the amplitude of the analog signal SIG. It can be seen that the sinusoidal analog signal SIG is digitalized (restored) based on CODE[i] by the above-described processing.

Next, more detailed exemplary processings of the waveform 1 according to the second embodiment will be described with reference to FIG. 11 and FIG. 12. FIG. 11 is a flowchart of exemplary processings of the waveform sensor 1 according to the second embodiment. FIG. 12 is a timing chart of exemplary processings of the waveform sensor 1 according to the second embodiment. The order of the processings in FIG. 11 may be changed as needed unless the processings are inconsistent with each other.

In step S101, the controller 15A causes the ADC circuits 16 to take (receive) input of the analog signal SIG from the antenna coil by setting the state RS of the input signal rest switch 13 to LOW. The controller 15A then performs initialization by setting all of the auto-zero signals AZ[1:n] and the control signals TH[1:n] to HIGH (step S102). The controller 15A then sets "1" to the number (index) i of the ADC circuit 16 (step S103).

The controller 15A then causes the sample-and-hold circuit 161-*i* to receive input of the analog signal SIG[i−1] of timing t*i-1* by setting the auto-zero signal AZ[i] for the ADC circuit 16-*i* to LOW at previous sampling timing t*i-1* (step S104).

The controller 15A then turns on switch of the ADC circuit 16-*i* by setting (changing) the control signal TH[i] for the ADC circuit 16-*i* to LOW at sampling timing t*i*, and causes the sample-and-hold circuit 161-*i* to record (to sample and hold) the value indicating the absolute value of the change in amplitude of the analog signal SIG from timing t*i-1* to timing t*i*(step S105).

The controller 15A then determines whether "i" is equal to "n" (step S106). When "i" is not equal to "n" (NO in step S106), the controller 15A increments the value of "i" by one (step S107), and proceeds to the processing in step S104.

On the other hand, when "i" is equal to "n" (YES in step S106), the controller 15A latches the output result of the second amplifier in each ADC circuit 16 as a signal for SIGN by setting the signal GT to HIGH (step S108).

The controller 15A then holds the value SIGN[1:n] indicating the polarity of each ADC circuit 16 by setting the signal GT to LOW (step S109). The controller 15A then selects (determines) the RAMP signal used for each ADC circuit 16 by using the upstream RAMP signal and the downstream RAMP signal on the basis of the values SIGN [1:n] indicating the polarity of the output of the ADC circuit 16 (step S110).

The ADC circuit 16 then AD converts the AD-converted value DOUT of the counter value corresponding to the level held in the sample-and-hold circuit 161 by use of the selected RAMP signal for the ADC circuit 16, and outputs the AD-converted result value DOUT to the multiply-add calculator circuit 21 (step S111).

The multiply-add calculator circuit 21 then performs a multiply-add calculation on the AD-converted result value DOUT of the ADC circuit 16 and the polarity value SIGN of the ADC circuit 16 by use of the mathematical expression 1 (step S112). The polarity value SIGN of the ADC circuit 16 indicates a polarity value of the change in amplitude of the voltage (voltage difference) of the analog signal SIG of each sampling timing in the ADC circuit 16 from its previous sampling timing. When the amplitude of the voltage of the analog signa SIG increases from the previous sampling timing to the present sampling timing, the polarity value indicates +1. When the amplitude of the voltage of the analog signal SIG decreases from the previous sampling timing to the present sampling timing, the polarity value indicates −1.

FIG. 12 illustrates an example of an amplitude 1201 of the voltage of the analog signal SIG from one antenna coil, the state RS of the input signal reset switch 13, the auto-zero signals AZ[1] to [16], the control signals TH[1] to [16] from the controller 15A to the ADC circuits 16, the signal GT, and the value (Global Counter) of the global counter 18 assuming that the number "n" of ADC circuits 16 is 16 and the horizontal axis represents time. FIG. 12 further illustrates a waveform 1202 of the upstream RAMP signal (URAMP) and a waveform 1203 of the downstream RAMP signal (DRAMP).

Since the polarity value SIGN[1] of the ADC circuit 16-1 is −1, the downstream RAMP signal is selected as the RAMP signal for the ADC circuit 16-1.

FIG. 12 further illustrates a comparison between a waveform 1211 of the input voltage VINP[1] at the first terminal 160A receiving input of the analog signal SIG and a waveform 1212 of the input voltage VINM[1] (a waveform of the voltage of the RAMP signal) at the second terminal 160B receiving input of the RAMP signal in the ADC circuit 16-1. Since the ADC circuit 16 is the so-called single-slope ADC, a digital value corresponding to the voltage of the analog signal SIG obtained when the waveform 1211 crosses with the waveform 1212 is AD converted and output.

FIG. 12 further illustrates the polarity value SING[1] of the ADC circuit 16-1, the output state COMPOUT[1] from the ADC circuit 16-1 to the latch 19-1, and the AD conversion result (conversion result ADC1) of the ADC circuit 16-1.

Third Embodiment

In the second embodiment, for example, when the output of the ADC circuit 16 is relatively near zero, the value SIGN indicating the polarity of the output may be erroneous due to device noise or the like. In this case, the RAMP signal is erroneously selected in the processing in step S110 in FIG. 11, and thus the waveform of the input voltage VINP at the first terminal 160A receiving input of the analog signal SIG does not cross with the waveform of the input voltage VINM at the second terminal 160B receiving input of the RAMP signal. In this case, since the ADC circuit 16 is the so-called single-slope ADC, the maximum counter value is output as the AD conversion result. Therefore, a relatively large AD conversion error occurs.

In a third embodiment, an error correcting function used when the error occurs in the value SIGN indicating the polarity of the output due to device noise or the like in the second embodiment is mounted to reduce the AD conversion errors. Differences of the third embodiment from the second embodiment will be mainly described below.

<Configuration>

A configuration of the waveform sensor 1 according to the third embodiment will be described with reference to FIG. 13. FIG. 13 is a diagram of an exemplary configuration of the waveform sensor 1 according to the third embodiment. The waveform sensor 1 according to the third embodiment is different from the waveform sensor 1 according to the second embodiment in FIG. 6 in that it includes a RAMP generation circuit 14B, a controller 15B, and a multiply-add calculator circuit 21B instead of the RAMP generation circuit 14A, the controller 15A, and the multiply-add calculator circuit 21.

The waveform sensor 1 according to the third embodiment is mainly different from the waveform sensor 1 according to the second embodiment in FIG. 6 in that the ADC circuits 16-1, 16-2, . . . , 16-n include calibration value storage latches 30-1, 30-2, . . . , 30-n configured to store a calibration value for each ADC circuit 16 (which may be simply denoted as "calibration value storage latch(es) 30" later unless discrimination is necessary), respectively.

A calibration value DCAL[i] for the ADC circuit 16, which is stored in the calibration value storage latch 30, is a value for calibrating the AD conversion result value DOUT[i] of the ADC circuit 16 in accordance with device noise or the like caused in the ADC circuit 16.

The controller 15B is different from the controller 15A according to the second embodiment in that it transmits a control signal DCAL_LATCH to the calibration value storage latches 30.

To the ADC circuits 16, the RAMP generation circuit 14B outputs a signal (redundant upstream RAMP signal) whose voltage linearly (in linear function form) increases with respect to time with a specific negative value as an intercept and a signal (redundant downstream RAMP signal) whose voltage linearly (in linear function form) decreases with respect to time with a specific positive value as an intercept. In this manner, even when the error occurs in the value SIGN indicating the polarity of the output due to device noise or the like to erroneously select the RAMP signal, the waveform of the input voltage VINP at the first terminal 160A receiving input of the analog signal SIG crosses with the waveform of the input voltage VINM at the second terminal 160B receiving input of the RAMP signal.

The multiply-add calculator circuit 21B calculates the value CODE[i] indicating the amplitude of the analog signal SIG of timing $t_i$ by using the following expression 2.

[Mathematical Expression 2]

$$CODE[i] = \sum_{i=1}^{n} (DOUT[i] - DCAL[i]) \cdot SIGN[i] \qquad (2)$$

In the expression 2, multiplication of the value SIGN and a calibrated value (DOUT[i]-DCAL[i]) of the value DOUT by the calibration value DCAL is calculated for the ADC circuits 16 from the ADC circuit 16-1 to the ADC circuit 16-i, and the values of the ADC circuits 16a are added (accumulated). The values DOUT[i]-DCAL[i] are zero or larger in the normal state, and are negative values in the error occurrence state due to device noise or the like. Further, in the error occurrence state, the sign of the polarity value SIGN is erroneous (positive or negative of the sign is reversed). Thus, the values DOUT[i]-DCAL[i] are multiplied by the polarity value SIGN[i] to correct the positive or negative of the sign in the error occurrence state.

<Processings (Operations)>

The waveform sensor 1 according to the third embodiment performs a processing of storing the calibration value DCAL into the calibration value storage latch 30 before performing the processing of AD converting the analog signal SIG.

<<Processing of Storing Calibration Value DCAL in Calibration Value Storage Latch 30>>

An exemplary processing of storing the calibration value DCAL into the calibration value storage latch 30 according to the third embodiment will be described with reference to FIG. 11 and FIG. 14. FIG. 14 is a timing chart of an exemplary processing of storing the calibration value DCAL into the calibration value storage latch 30 according to the third embodiment.

The processing of storing the calibration value DCAL into the calibration value storage latch 30 is similar to the processing of AD converting the analog signa SIG in the waveform sensor 1 according to the second embodiment illustrated in FIG. 11 except that the reception of the input at the first terminal 160A is not the analog signal SIG but a ground (GND). Thus, the flowchart of the exemplary processing of storing the calibration value DCAL into the calibration value storage latch 30 may be interpreted so that the "analog signal SIG" in FIG. 11 is replaced with the "ground (GND)" or the like.

The waveform sensor 1 according to the third embodiment causes the first terminal 160A intended to receive input of the analog signal SIG but to receive input of the ground (GND) in the ADC circuit 16 by setting (switching) the state RS of the input signal reset switch 13 to HIGH instead of step S101 in FIG. 11. Then, in this state, the waveform sensor 1 according to the third embodiment AD converts the AD-converted value DOUT of the counter value corresponding to the level held in the sample-and-hold circuit 161 while the ground is input by use of the similar processings to the processings in step S102 and its subsequent steps in FIG. 11. The waveform sensor 1 according to the third embodiment then stores the data of the value DOUT into the calibration value storage latch 30 by setting the control signal DCAL_LATCH stored into the calibration value storage latch 30 to HIGH.

FIG. 14 illustrates an example of an amplitude 1401 of the voltage input into the first terminal 160A, the state RS of the input signal reset switch 13, the auto-zero signals AZ[1] to [16], the control signals TH[1] to [16] from the controller 15B to the ADC circuits 16, the signal GT, and the value (Global Counter) of the global counter 18 assuming that the number "n" of ADC circuits 16 is 16 and the horizontal axis represents time. FIG. 14 further illustrates a waveform 1402 of the redundant upstream RAMP signal (URAMP) and a waveform 1403 of the redundant downstream RAMP signal (DRAMP).

Since the polarity value SIGN[1] of the ADC circuit 16-1 is −1, the redundant downstream RAMP signal is selected as the RAMP signal for the ADC circuit 16-1.

FIG. 14 further illustrates a comparison between a waveform 1411 of the input voltage VINP[1] at the first terminal 160A receiving input of the analog signal SIG and a waveform 1412 of the input voltage VINM[1] (a waveform of the voltage of the RAMP signal) at the second terminal 160B receiving input of the RAMP signal in the ADC circuit 16-1. Since the ADC circuit 16 is the so-called single-slope ADC, a digital value corresponding to the voltage of the analog signal SIG obtained when the waveform 1411 crosses with the waveform 1412 is AD converted and output.

FIG. 14 further illustrates the polarity value SIGN[1] of the ADC circuit 16-1, the output state COMPOUT[1] from the ADC circuit 16-1 to the latch 19-1, and the AD conversion result (conversion result ADC1) DOUT[1] of the ADC circuit 16-1.

FIG. 14 further illustrates the state of the control signal DCAL_LATCH and the calibration value DCAL[1] stored in the calibration value storage latch 30-1.

<<Processings of Ad Converting Analog Signal Sig>>

An exemplary processing of AD converting the analog signal SIG according to the third embodiment will be described with reference to FIG. 11 and FIG. 15. FIG. 15 is a timing chart of an exemplary processing of AD converting the analog signal SIG according to the third embodiment.

The waveform sensor 1 according to the third embodiment performs the above-described processing of storing the calibration value DCAL into the calibration value storage latch 30, and then, performs the similar processings to those of the waveform sensor 1 according to the second embodiment in FIG. 11. However, the waveform sensor 1 according to the third embodiment is different in that the multiply-add calculation in step S112 in FIG. 11 uses the expression 2 instead of the expression 1.

FIG. 15 illustrates an example of an amplitude 1501 of the voltage input into the first terminal 160A, the state RS of the input signal reset switch 13, the auto-zero signals AZ[1] to [16], the control signals TH[1] to [16] from the controller 15B to the ADC circuits 16, the signal GT, and the value (Global Counter) of the global counter 18 assuming that the number "n" of ADC circuits 16 is 16 and the horizontal axis represents time. FIG. 15 further illustrates a waveform 1502 of the redundant upstream RAMP signal (URAMP) and a waveform 1503 of the redundant downstream RAMP signal (DRAMP).

FIG. 15 further illustrates the polarity value SIGN[6] of the ADC circuit 16-6. FIG. 15 illustrates an example in which the polarity value SIGN[6] of the ADC circuit 16-6 is erroneously determined to be −1 due to an error caused by device noise or the like. Thus, the redundant downstream RAMP signal is selected as the RAMP signal for the ADC circuit 16-6.

FIG. 15 further illustrates a comparison between a waveform 1511 of the input voltage VINP[6] at the first terminal 160A receiving input of the analog signal SIG and a waveform 1512 of the input voltage VINM[6] (a waveform of the voltage of the RAMP signal) at the second terminal 160B receiving input of the RAMP signal in the ADC circuit 16-6. Since the ADC circuit 16 is the so-called single-slope ADC, a digital value corresponding to the voltage of the analog signal SIG obtained when the waveform 1511 crosses with the waveform 1512 is AD converted and output.

FIG. 15 further illustrates the output state COMPOUT[6] from the ADC circuit 16-6 to the latch 19-6 and the AD conversion result (conversion result ADC6) DOUT[6] of the ADC circuit 16-6.

<Exemplary Interleave Operation>

A plurality of circuits 10 may be provided for an interleave operation in the second embodiment and the third embodiment. In this manner, a period to be sampled can be made longer, and thus, an accuracy of the position detection or the like can be improved. In this case, for example, one set of the antennal coil changeover switch 11, the gain amplifier 12 and the input signal reset switch 13 may be commonly used among the circuits 10 in the waveform sensor 1. The analog signals SIG in different periods may be AD converted in the circuits 10, respectively.

<Others>

The above-described example in which the waveform such as a sinewave in wireless or the like is detected by an electronic pen or the like on a tablet or the like has been explained. However, the waveform sensor 1 according to the present disclosure is not limited to this example. The waveform sensor 1 according to the present disclosure is applicable to (utilized in) an ADC which is directed for, for example, detecting a receiving light wave by use of a time of flight (TOF) sensor configured to measure a distance to a measuring-target object on the basis of a phase difference between the receiving light wave and an emitting light wave such as sinusoidal wave.

In the foregoing, the invention made by the inventors of the present application has been concretely described on the basis of the embodiments. However, it is needless to say that the present invention is not limited to the foregoing embodiments, and various modifications can be made within the scope of the present invention.

What is claimed is:

1. A circuit comprising:
   a first circuit and a second circuit each comprising a sample-and-hold circuit configured to hold a level of an input signal of a specific timing and an analog-to-digital converter circuit configured to convert the level of the input signal held in the sample-and-hold circuit into digital data and to output the digital data, wherein the input signal is a sinusoidal signal detected by an antenna coil corresponding to a column of a waveform sensor; and a controller configured to cause the first circuit to output the level of the input signal of a first timing and to cause the second circuit to output the level of the input signal of a second timing.

2. The circuit according to claim 1, wherein the first circuit and the second circuit each comprises:

a first terminal configured to receive the input signal; and a second terminal configured to receive a reference signal changing at a constant slope, and wherein the analog-to-digital converter circuit acquires a counter value from a period at which a voltage of the reference signal changes to a period at which the input signal crosses with the reference signal.

3. The circuit according to claim 2, comprising:

a multiply-add calculator circuit configured to select the reference signal out of a first reference signal changing at a constant positive slope and a second reference signal changing at a constant negative slop, based on a polarity value of a difference between an amplitude of the input signal of the first timing and an amplitude of the input signal of the second timing, and configured to accumulate a value obtained by multiplying a value of the difference by the polarity value.

4. The circuit according to claim 3, wherein the first reference signal crosses with the second reference signal at a specific timing, and wherein the multiply-add calculator circuit accumulates multiplication of the polarity value and a value obtained by subtracting a calibration value that is analog-to-digital-converted result in a state in which the input signal is at a ground state from the value of the difference.

5. The circuit according to claim 1, wherein the sample-and-hold circuit comprises a first capacitance and a second capacitance, and when sampling of the input signal is completed at the first capacitance, the sample-and-hold circuit separates the first capacitance from the input signal, performs conversion of the input signal into digital data, and samples the input signal at the second capacitance.

6. A waveform sensor comprising:

a first circuit and a second circuit each comprising an input section configured to receive an input signal changing along with elapse of time, a sample-and-hold circuit configured to hold a level of the input signal of a specific timing, and an analog-to-digital converter circuit configured to convert the level of the input signal held in the sample-and-hold circuit into digital data and to output the digital data, wherein the input signal is a sinusoidal signal detected by an antenna coil corresponding to a column of the waveform sensor; and a controller configured to cause the first circuit to output the level of the input signal of a first timing and to cause the second circuit to output the level of the input signal of a second timing.

* * * * *